(12) United States Patent
Cherniski et al.

(10) Patent No.: US 7,182,644 B2
(45) Date of Patent: Feb. 27, 2007

(54) FILTERING ELECTROMAGNETIC INTERFERENCE FROM LOW FREQUENCY TRANSMISSION LINES AT A DEVICE ENCLOSURE

(75) Inventors: Andrew Michael Cherniski, Rescue, CA (US); Kirk Yates, Loomis, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/426,229

(22) Filed: Apr. 30, 2003

(65) Prior Publication Data

US 2004/0219837 A1 Nov. 4, 2004

(51) Int. Cl.
*H01R 13/66* (2006.01)
(52) U.S. Cl. ...................................... 439/620
(58) Field of Classification Search .............. 439/620, 439/607, 620.24, 620.01; 333/182, 185, 333/184, 181, 183; 361/302, 328, 329, 330, 361/725; 174/35 CC, 35 R
See application file for complete search history.

(56) References Cited

U.S. PATENT DOCUMENTS

| | | | |
|---|---|---|---|
| 4,187,481 A * | 2/1980 | Boutros | 333/182 |
| 4,867,706 A | 9/1989 | Tang | |
| 4,931,754 A * | 6/1990 | Moussie | 333/184 |
| 5,057,041 A | 10/1991 | Yu et al. | |
| 5,221,215 A | 6/1993 | Tan et al. | |
| 5,286,221 A | 2/1994 | Fencl et al. | |
| 5,415,569 A | 5/1995 | Colleran et al. | |
| 5,456,616 A | 10/1995 | Fuerst et al. | |
| 5,563,559 A * | 10/1996 | Stephens et al. | 333/182 |
| 5,580,280 A | 12/1996 | Minich et al. | |
| 5,599,208 A | 2/1997 | Ward | |
| 5,624,277 A | 4/1997 | Ward | |
| 5,647,766 A | 7/1997 | Nguyen | |
| 6,086,422 A | 7/2000 | Glynn | |
| 6,159,049 A | 12/2000 | Schramme et al. | |

FOREIGN PATENT DOCUMENTS

| | | |
|---|---|---|
| EP | 0 391 257 | 2/1994 |
| FR | 2825523 | 12/2002 |
| GB | 2338354 | 12/1999 |
| GB | 2349515 | 11/2000 |

* cited by examiner

*Primary Examiner*—Alexander Gilman

(57) ABSTRACT

An electrical device having an enclosure in which noise is parasitically induced in a wire located in the interior of the enclosure is disclosed. The electrical device has an entry connector for mating the wire with an external connector at which a transmission line terminates for preventing the induced noise from being emitted from the device enclosure via the transmission line. The electrical device comprises a printed circuit board (PCB) adapted to be mounted adjacent to an opening in a wall of the enclosure, a receptacle, integral with the PCB, configured to mate with the external connector, a first conductive path coupling the transmission line with the wire when mated, and capacitors mounted on the printed circuit board radially disposed around the receptacle and adapted to be electrically coupled to the external connector when mated. The electrical device further comprises a second conductive path coupling the capacitors to a low potential sink.

26 Claims, 6 Drawing Sheets

FILTERING ELECTROMAGNETIC INTERFERENCE FROM LOW FREQUENCY TRANSMISSION LINES AT A DEVICE ENCLOSURE

BACKGROUND

The present invention relates generally to electromagnetic interference (EMI) and, more particularly, to filtering EMI from low frequency transmission lines at a device enclosure.

Radio frequency (RF) interference and other emitted radiation is a known problem, particularly in the field of computer systems and other electronic devices. Global standards have been developed and are in use specifying acceptable ranges and amplitudes of permitted emitted interference. Yet it has proven difficult to effectively and inexpensively restrict or otherwise limit undesired interference in compliance with the standards.

Many computer devices and other electronic devices have high-speed clock circuits and switching circuitry, that demand high-levels of instantaneous current, causing high frequency radiated emissions. Electrical cables in proximity to that circuitry receive these emissions, and can transmit or otherwise carry the emissions. If not removed or at least decreased, such emissions can be emitted by the cables outside the device chassis, particularly by cables that penetrate through the chassis. For example, cables that provide input/output and power are generally implicated as radiation sources.

Conventionally, some emission mitigation is afforded for AC power transmission lines (e.g., power cords) through use of a combination of customized line filters and circuit isolation inherent in the design topology of AC power supplies. However, systems that require DC power directly, such as telecommunication systems, do not have the circuit isolation advantage found in AC supplies. As a result, DC power cables and DC powered servers have been notoriously noisy sources of destructive radio interference emissions.

SUMMARY

In an embodiment of the present invention, an electromagnetic interference (EMI) filter for filtering noise from a low frequency transmission line is disclosed. The EMI filter filters noise at a location at which the transmission line traverses a device enclosure wall. The EMI filter comprises a plurality of high frequency filters radially disposed around the transmission line at a location adjacent to the enclosure wall, wherein the filters electrically couple the transmission line to a low potential sink such that noise within a particular frequency range appearing on the transmission line is carried to the low potential sink through the high frequency filters.

In another embodiment of the present invention, an electrical device having an enclosure in which noise is parasitically induced in a wire located in the interior of the enclosure is disclosed. The electrical device has an entry connector for mating the wire with an external connector at which a transmission line terminates for preventing the induced noise from being emitted from the device enclosure via the transmission line. The electrical device comprises a printed circuit board (PCB) adapted to be mounted adjacent to an opening in a wall of the enclosure, a receptacle, integral with the PCB, configured to mate with the external connector, a first conductive path coupling the transmission line with the wire when mated, and capacitors mounted on the printed circuit board radially disposed around the receptacle and adapted to be electrically coupled to the external connector when mated. The electrical device further comprises a second conductive path coupling the capacitors to a low potential sink.

In a further embodiment of the present invention, a device comprising at least one electrical component that can emit electromagnetic interference (EMI) is disclosed. The device comprises an enclosure defining an interior of the device in which the at least one component is located, at least one wire disposed within the enclosure susceptible to having noise induced thereon from the emitted EMI, and an entry connector adapted to mate to an external connector terminating a low frequency transmission line. The entry connector comprises a printed circuit board (PCB) configured to be mounted on an interior surface of a wall of the enclosure covering at least in part a portion of an opening in the wall, means, disposed on the PCB, for electrically coupling the external connector with the internal wire, and means for filtering to a low potential sink the noise indicted on the wire at the electrical coupling means immediately adjacent to the enclosure wall.

DETAILED DESCRIPTION

The present invention is an electromagnetic interference (EMI) filter for preventing high frequency EMI (sometimes simply referred to as "noise" hereafter) from occurring on a low frequency transmission line connected to an electrical device. The present invention filters the noise at a location adjacent to where the transmission line traverses a device enclosure, thereby preventing noise from exiting or entering the device enclosure via the transmission line. The present invention can be implemented in any electrical device which can emit EMI from a transmission line traversing its enclosure. In the following description the present invention is described in connection with one such device, generally referred to herein as a telecommunications device. Telecommunications (telecom) devices typically have one entry connector through which the device transmits and/or receives DC power and, perhaps, an entry connector through which the device transmits and/or receives other low frequency signals such as data signals. Like other electrical devices, telecom devices are typically housed in an enclosure defining a device interior. Wires coupled to the entry connector(s) traverse the device interior, carrying power to device components and, if present, carrying low frequency signals between an entry connector and device components.

High frequency noise can be induced in such wires, and can be carried out of the enclosure through the DC power or other low frequency transmission lines. The present invention filters high frequency noise appearing on the internal wires proximate to the location at which the transmission lines traverse the enclosure thereby preventing the noise from being emitted from the device enclosure. Although it need not be implemented as such, one embodiment of the EMI filter of the present invention described below is configured as an entry connector for a telecom device. It will become apparent from the present disclosure, however, that the invention is not so limited and can be implemented in other configurations as well.

Figure 1A:
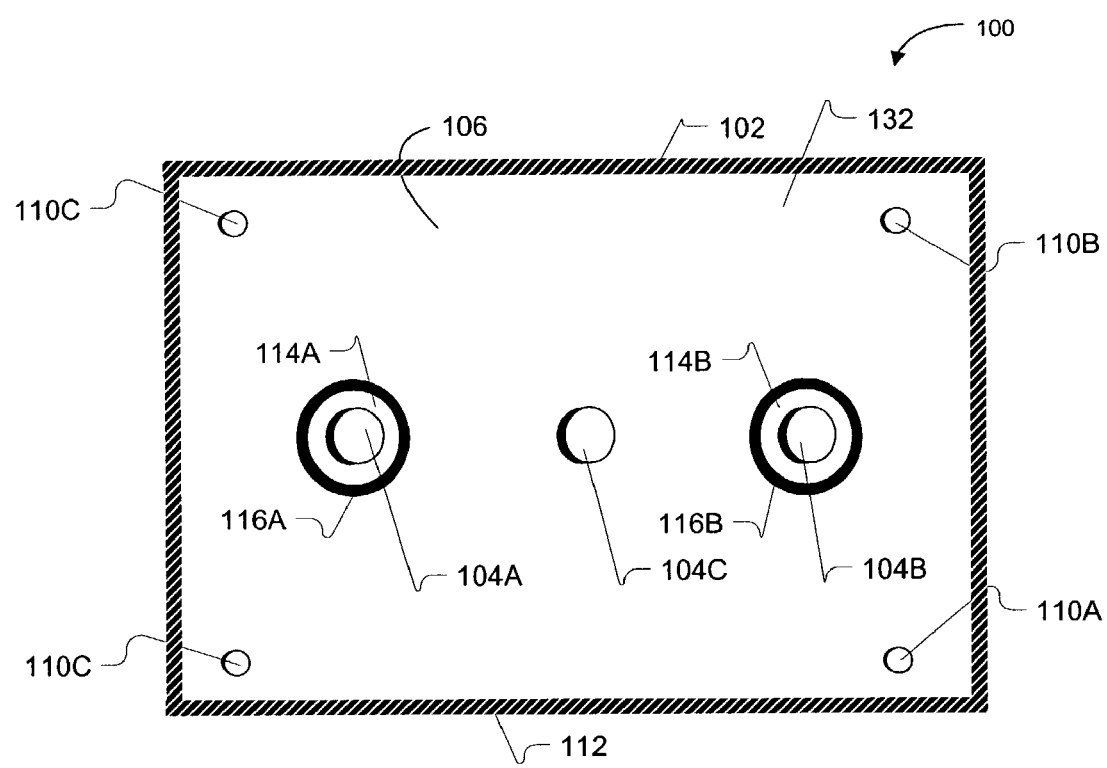
FIG. 1A is a perspective view of a mating of a filtering connector implementing one embodiment of the filter of the present invention.
Figure 1B:
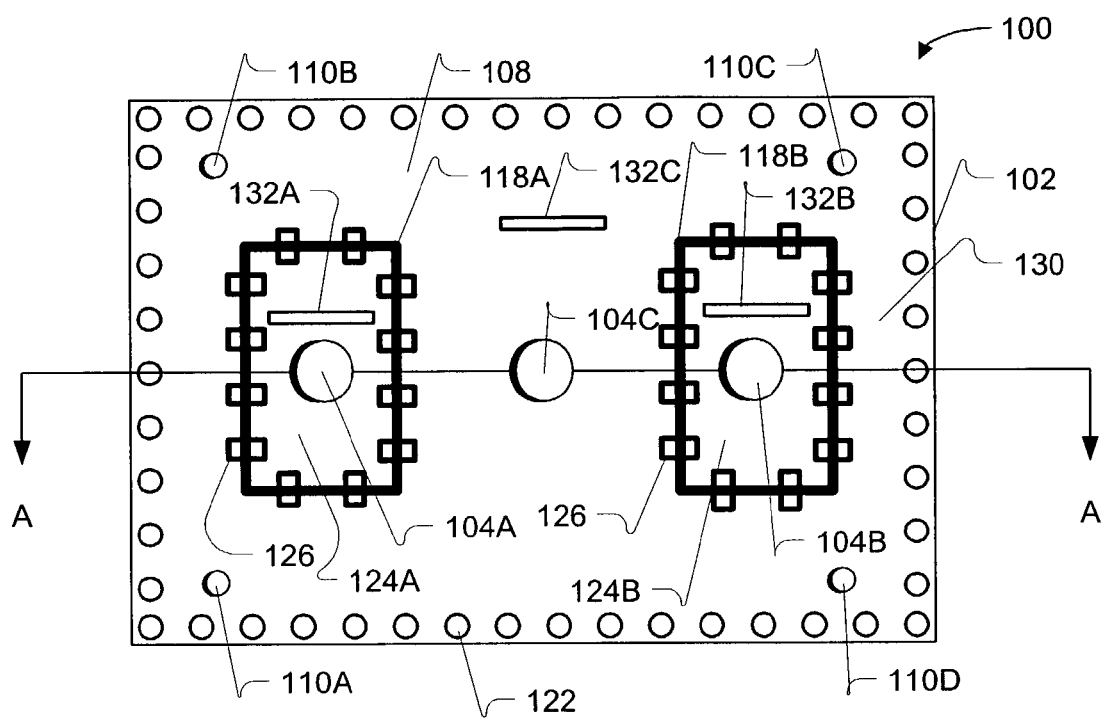
FIG. 1B is a perspective view of a filtering side of the filtering connector of FIG. 1A.
Figure 2A:
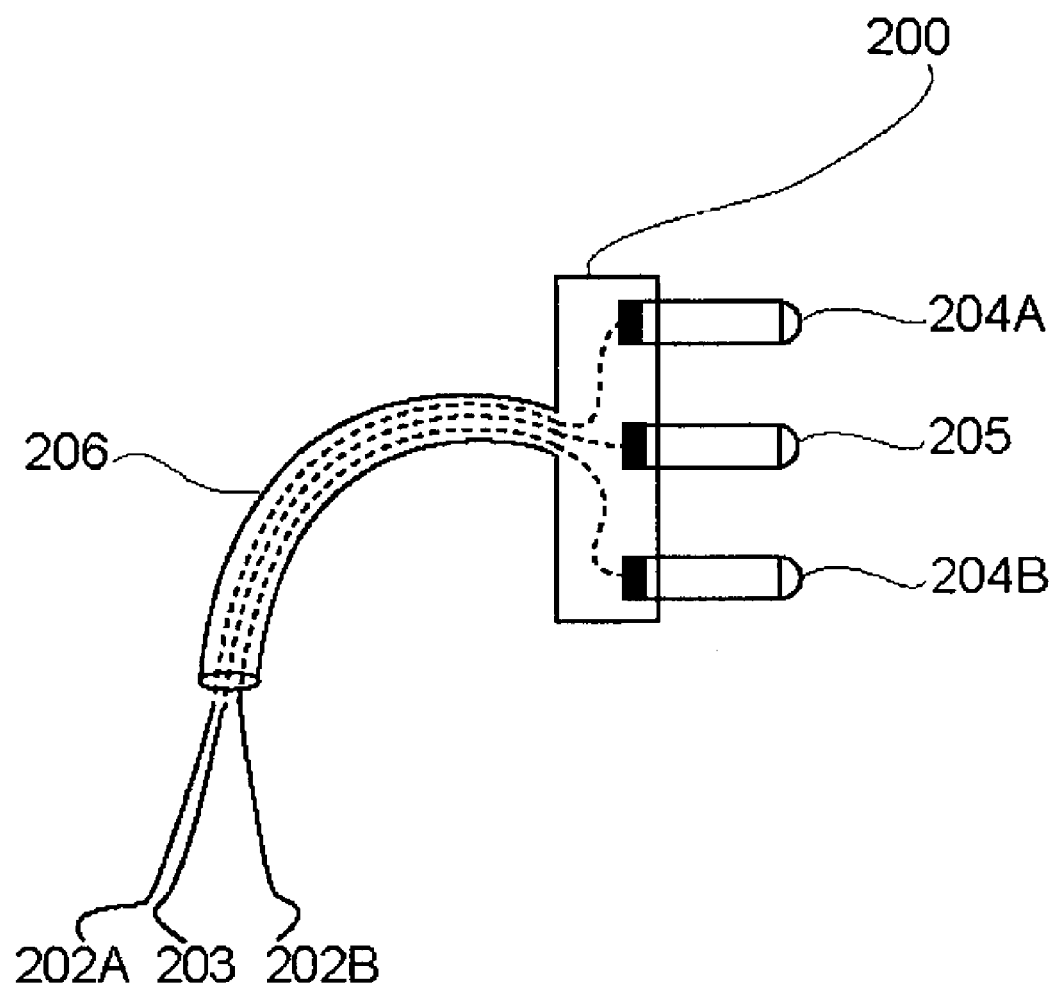
FIG. 2A is a schematic view of a transmission line and external connector carrying low frequency signals to/from an electrical device suitable for implementing embodiments of the present invention.

FIGS. 1A and 1B are perspective views of opposing sides of a connector implementing an entry EMI filter according to one embodiment of the present invention, referred to herein as filtering entry connector 100. Typically, the noted low frequency transmission lines terminate in a connector, referred to herein as an external connector, which mates with a device entry connector. Such mating connectors often provide for the capability to physically disconnect from each other. The exemplary embodiment of filtering entry connector 100 illustrated in FIGS. 1A and 1B is configured to receive the DC power transmission connector 200 illustrated in FIG. 2A. Power transmission connector 200 is commonly used to power telecommunications equipment, and includes three linearly-arranged pins 204A, 204B and 205. Transmission lines 202A and 202B terminate at pins 204A and 204B, respectively. Transmission line 202A carries a negative 484 volt power signal while transmission line 202B carries a positive 48 volt power return signal. A third line 203 terminates at pin 205 to provide a safety ground. Transmission lines 202 and ground line 203 are housed in a cable 206 integral with connector 200.

Figure 2B:
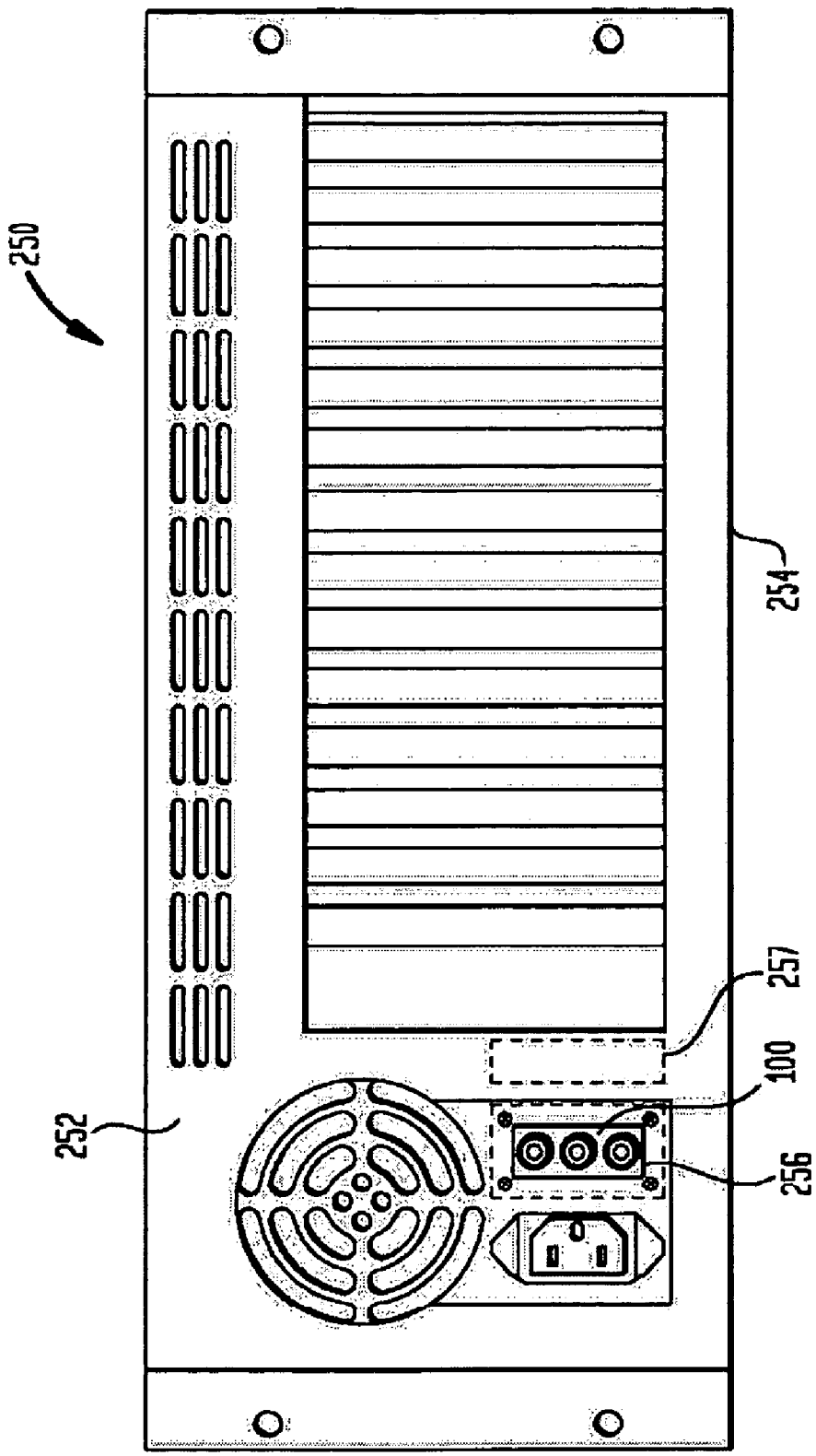
FIG. 2B is a perspective view of a back panel of a telecommunications device suitable for implementing a filtering connector of the present invention.

FIG. 2B is a perspective view of a back panel 252 of an exemplary telecommunications device 250 in which the present invention can be implemented. Telecommunications device 250 is adapted to be connected to power connector 200. Electronics devices such as device 250 generally include a housing, commonly referred to as a chassis or enclosure 254 ("enclosure 254" herein), in which components of device 250 are located. Enclosure 254 of telecom device 250 is formed of a plurality of such walls of which one is back panel 252. One or more walls of enclosure 254 have a window or opening 256 ("opening 256" herein) through which such transmission lines travel. In this exemplary application, transmission lines 202 and 203 (in the form of pins 204 and 205) traverse enclosure wall 252 at opening 256. As noted, the entry EMI filter of the present invention filters noise emanating in the interior of device 250 to prevent such noise from being emitted from enclosure 254 via transmission lines 202. To maximally filter induced noise from the transmission line, an EMI filter is electrically coupled to each transmission line 202 at the location that the transmission line 202 traverses device enclosure 254. In this exemplary application, the EMI filter is implemented as filtering entry connector 100 to physically and electrically connect ("mate" herein) with power connector 200.

Figure 3A:
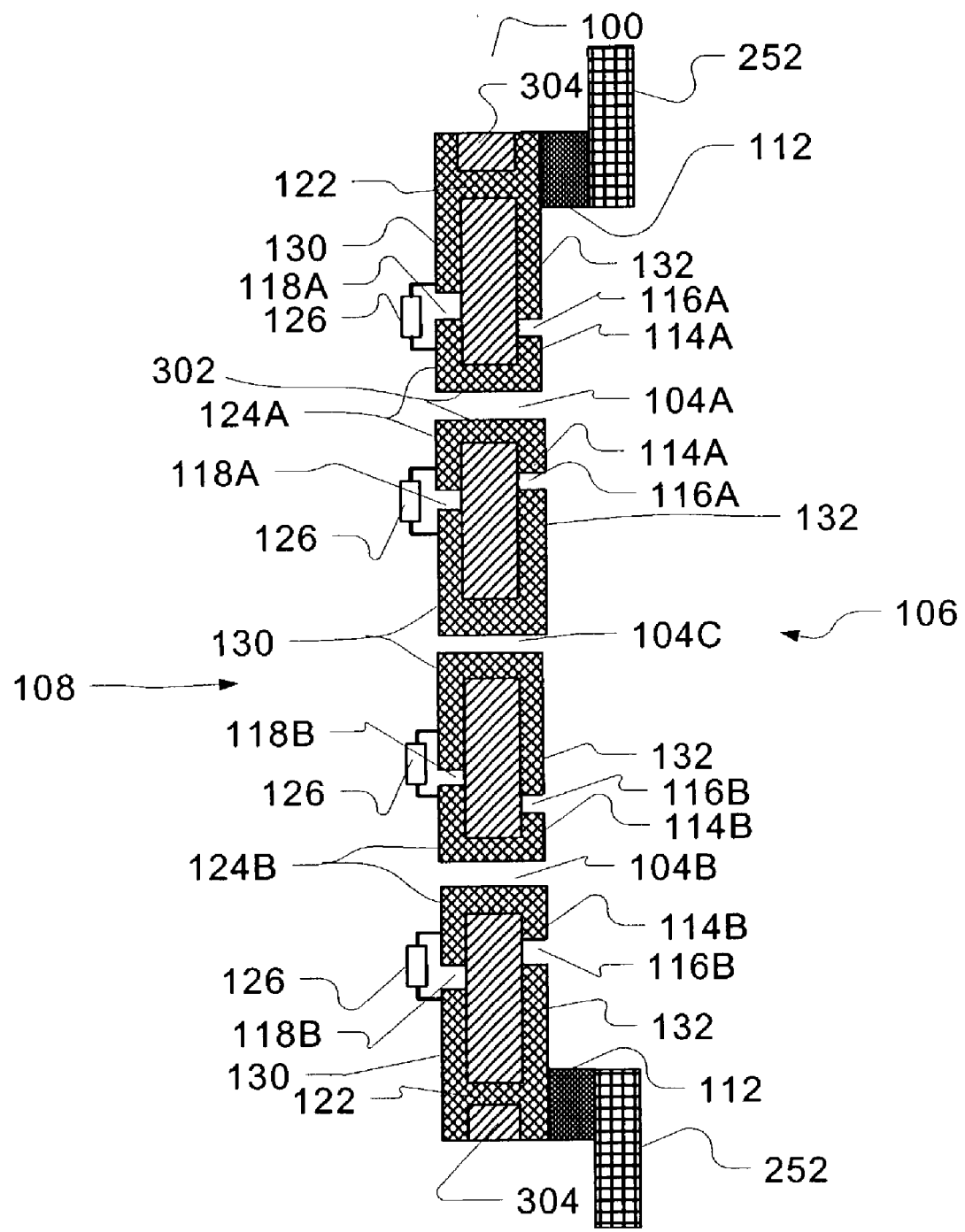
FIG. 3A is a cross-sectional view of the filtering connector taken along section line A—A in FIG. 1B.
Figure 3B:
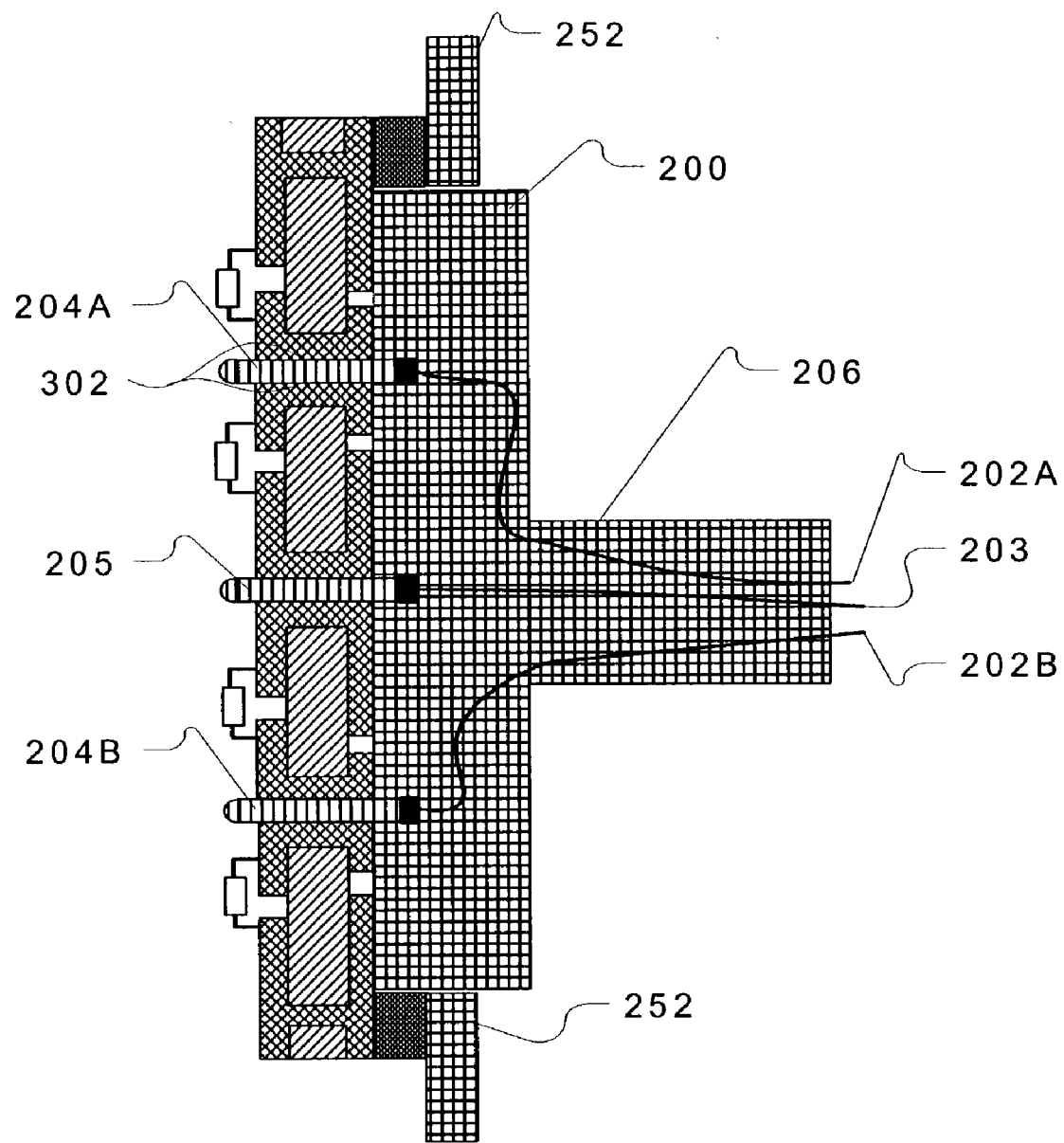
FIG. 3B is the cross-sectional view of the filtering connector shown in FIG. 3A mated with the external connector shown in FIG. 2A.

Filtering entry connector 100 will now be described in detail with reference to FIGS. 1A and 1B as well as FIGS. 3A and 3B. FIG. 3A is a cross-section view of the embodiment of filtering entry connector 100 illustrated in FIGS. 1A and 1B taken along section line A—A of FIG. 1B. FIG. 3B is the same cross-sectional view with filtering entry connector 100 mated to external connector 200.

Filtering entry connector 100 includes a support structure 102 adapted to mate with power connector 200. In this exemplary embodiment in which the invention is implemented as an entry connector, support structure 102 is preferably a rigid printed circuit board having sufficient structural integrity to withstand forces associated with the mating of external connector 200. In one embodiment, support structure 102 is a commercially available circuit board or card, for example, of a PC board variety having an FR-4 core 304 (FIGS. 3A, 3B). One suitable support structure 102 can be, for example, a conventional printed circuit board having two etchable surfaces 130, 132 (described below), and optionally, having a capability to plate through-drilled holes.

In the following description this and other similar support structures are referred to as "base plate 102." It should be appreciated that in alternate embodiments, support structure 102 need not be a printed circuit board, or other rectangular structure having two dimensions which are substantially greater than its thickness. This is described in further detail below.

Base plate 102 has opposing sides 106 and 108, and a plurality of receptacles in the form of apertures 104 which extend through base plate 102 from side 106 to side 108. Although they need not be, sides 106, 108 have substantially planar surfaces. Each aperture 104 is sized to slidably receive one transmission line pin 204, 205. FIG. 1A is a perspective view of base plate side 106 which is to receive connector 200 when attached thereto. As such, side 106 is sometimes be referred to herein as mating side 106 of base plate 102 and/or connector 100. FIG. 1B is a perspective view of base plate side 108 which has mounted thereon a plurality of high frequency filters 126 described in detail below. As such, side 108 is sometimes be referred to herein as filtering side 108 of base plate 102 and/or connector 100.

It should be appreciated that receptacles need not be implemented as apertures 104 and that other receptacle configurations can be implemented to electrically and physically connect with pins 204 and 205 of connector 200. For example, rather than apertures, a connector having individual recesses each for receiving a pin 204, 205 can be implemented in certain embodiments. It should also be appreciated that external connector 200 may be implemented with recesses and entry connector 100 implemented with pins. The present invention can be implemented in this and other signal connector configurations. In such connector configurations the enclosure traversed by the portion of the external connector terminating the transmission line(s) is a plane formed by the mating face of the entry connector.

As shown in FIGS. 2B and 3B, filtering entry connector 100 is preferably located immediately adjacent to opening 256 to filter noise carried on transmission lines 202 in the vicinity at which lines 202 (in the form of pins 204) traverse enclosure 254. Preferably, base plate 102 has a height and width slightly larger than that of opening 254 so that, when mounted in enclosure 254, base plate 102 completely covers opening 256, as shown in FIGS. 2B, 3A and 3B. In FIG. 2B, filtering entry connector 100 is partially exposed through opening 256 and is partially hidden behind back panel 252. Because a portion of filtering entry connector 100 is behind back panel 252, the perimeter of filtering entry connector 100 is depicted by dashed lines in FIG. 2B. In one embodiment, base plate 102 is approximately 1 inch by 2 inches while opening 256 is approximately 0.5×1.5 inches. Of course, the size of opening 256 and base plate 102 depends on the quantity, size and arrangement of pins 204 and connector 200, and whether or not base plate 102 is to completely or partially cover opening 256.

Mounting of base plate 102 to enclosure 254 can be accomplished via mounting holes 110A–110D disposed through base plate 102. The quantity and placement of mounting holes 110 should be sufficient to transfer forces applied to base plate 102 to the enclosure wall, here back panel 252. In this illustrative embodiment, four mounting holes 110 located at opposing corners of rectangular base plate 102 are provided for that purpose. It should be appreciated, however, that in other applications a different quantity of mounting holes can be implemented, and that the implemented mounting holes 110 can be at locations other than that illustrated in this exemplary embodiment. The illustrated mounting holes 110 are sized to receive conventional nut/bolt or screw arrangements. However, other known permanent or removable mounting means can be utilized to secure base plate 102 to enclosure 254. For example, in alternative embodiments, snap-fit or rivet arrangements are used.

One embodiment of filtering entry connector 100 will now be described with reference to filter side 108 of base plate 102 shown in FIGS. 1B, 3A and 3B. Filter side 108 of base plate 102 includes two conductive lands 124A, 124B each surrounding an aperture 104A, 104B. Conductive lands 124A, 124B are configured to electrically mate with a corresponding power pin 204A, 204B inserted through the corresponding aperture 104A, 104B. Each aperture 104 has a conductive interior surface 302 (FIGS. 3A, 3B) to facilitate signal coupling. In addition, base plate 102 has a conductive surface 130 applied to the remainder of filter side 108. Conductive lands 124 are electrically insulated from conductive coating 130 by insulating regions 118A and 118B, respectively. In the above-noted embodiment in which base plate 102 is a conventional printed circuit board having etchable conductive surfaces, insulating regions 118 are voids formed by etching the surface of filtering side 108. Such an etching creates conductive lands 124 and conductive surface 130 which is electrically insulated from conductive lands 124.

Mounted on conductive lands 124A, 124B are internal connectors 132A, 132B, respectively, for connecting to wires, leads or cables ("wires" herein; not shown) having a distal end connected, for example, to a DC power supply 257 located within enclosure 254. Internal connectors 132A, 132B are electrically coupled to power pins 204A, 204B via apertures 104A, 104B (preferably plated with conductive coating 302) and conductive land 124A, 124B, respectively. Similarly, mounted on conductive surface 130 is a connector 132C to which the noted internal wire is connected. The distal end of this wire is connected to a ground terminal of the DC power supply. In one embodiment, connectors 132 are "fast-on" blade connectors, although any type of connector can be used. In an alternative embodiment the internal wire is simply soldered to connective surface 130, and conductive lands 124. In alternative embodiments other means for connecting internal wires to conductive lands 124 and conductive surface 130 can be used. It should be appreciated that internal connectors 132 can take on any form to electrically couple the appropriate internal wire to conductive surface 130 and conductive lands 124.

As noted, the present invention provides a low impedance path to a low potential sink (not shown) for high frequency noise carried on internal wires connected to transmission lines 202. Such a low potential sink is preferably the source of the low frequency signals. In this example in which the low frequency signals are DC power signals, the source of the noise would be the noted DC power supply located within enclosure 254 of telecommunications device 250. Of course, the low potential sink can also be chassis ground or earth. In this exemplary application, the low impedance sink is described as being chassis ground.

In this embodiment, the noted internal wires are electrically connected to transmission lines 202 through connectors 132A, 132B and conductive lands 124A, 124B. Thus, the signal path includes internal wires (not shown), connectors 132A, 132B, conductive lands 124A, 124B with plated 302 apertures 104A, 104B, pins 204A, 204B and transmission lines 202A, 202B, respectively. The present invention comprises at least one and preferably a plurality of high-frequency filters 126 (illustrated schematically as rectangles in FIGS. 1B and 3B) associated with and electrically coupled to the low frequency signal path proximate to the location at which the signal path transmission line (in form of pins 204) traverse the enclosure wall. In one embodiment, high frequency filters 126 are chip-variety capacitors of a surface-mount design. Such capacitors are inexpensive, small and reliable, making them preferred for use in an entry connector application such as filtering entry connector 100. Each capacitor 126 is preferably manufactured of a dielectric formulation to reduce variances in inductance, e.g., "stray" inductance. For ease of description, high frequency filters 126 will sometimes be referred to herein as capacitors 126. It should be appreciated, however, that each high frequency filter 126 can include other analog devices and can include other types of capacitors as well. As one of ordinary skill in the art would find apparent, for example, hybrid-designed filters can be used rather than chip-capacitors. In a still further embodiment, high frequency filters 126 comprise capacitors of differing configurations.

In one embodiment, high frequency filters 126 are electrically coupled to conductive lands 124A, 124B, although in other embodiments high frequency filters 126 can be electrically coupled to other portions of the signal path immediately adjacent or proximate to enclosure opening 256. It should also be appreciated that in other applications, the EMI filter of the present invention filters high frequency noise carried on transmission lines which are contiguous in the region of the enclosure wall. Such transmission lines may not include an external connector dictating the use of an entry connector, or may be configured to provide an entry connector located at some distance from the device enclosure. In such applications there is no entry connector interposed between segments of the transmission lines at the location the transmission lines traverse the device enclosure. It should be apparent to those of ordinary skill in the art that in such applications, the EMI filter of the present invention need not be implemented as part of an entry connector.

The low impedance path to chassis ground is provided in part by device 250 and in part by filtering entry connector 100. With regard to device 250, chassis ground is typically accessible via a conductive enclosure wall although some devices provide dedicated conductors. In this exemplary application, back panel 252 to which filtering entry connector 100 is mounted is a conductive enclosure wall connected to chassis ground.

With regard to filtering entry connector 100, a low impedance conductive path is provided between conductive lands 124 and back panel 252. As shown in FIGS. 2B, 3A, 3B, mating side 106 is physically and electrically secured to conductive back panel 252 when filtering entry connector 100 is installed in device 250, thereby providing a low impedance conductive path between conductive lands 124 and back panel 252 and, therefore, with chassis ground. Capacitors 126 extend over insulation regions 118A, 118B, with one lead of each capacitor 126 connected to a conductive land 124A, 124B, and another lead connected to conductive surface 130. Conductive surface 130 provides a low impedance conductive path from capacitors 126 to conductive vias 122 extending through base 102 from filter side 108 to mating side 106. In this particular embodiment, connector 100 includes a conductive gasket 112 configured to be fixed to mating side 106 over conductive vias 122. When connector 100 is secured to back panel 252, conductive gasket 112 provides a low impedance connection between the low impedance path provided by device 250 and that provided by filtering entry connector 100.

As one of ordinary skill in the art would find apparent, because the noise being filtered by the present invention is high frequency noise, the dimensions of the above segments of the low impedance conductive paths to chassis ground provided by filtering entry connector 100 and device 250 should be configured to minimize inductance. In the illustrative embodiment this is achieved, for example, by providing a broad conductive surface 130, numerous vias 122 distributed around the perimeter of base plate 102, and a contiguous conductive gasket 112. It should be appreciated that the structure and dimension of such conductive segments can be selected based on the frequency range of the filtered noise as well as other factors such as the current and voltage of the low frequency signals carried on transmission lines 202. In the exemplary application of DC power transmission signals for telecommunications devices, for example, the conductive elements are selected to be capable of carrying at least 50A an +/−48VDC. Each of the above segments of the low impedance conductive path of filtering connector 100 are described in further detail below.

The high frequency filter arrangement of the present invention will now be described with reference to FIGS. 1B and 3B. As noted, conductive lands 124A, 124B and associated conductive apertures 104A, 104B provide a conductive path between connectors 132A, 132B and pins 204A, 204B inserted in apertures 104A, 104B. Noise parasitically induced in wires connected to connectors 132A, 132B are delivered to conductive lands 124A, 124B through connectors 132A, 132B, respectively. The noise travels across the surface of conductive lands 124A, 124B, seeking a low impedance path to the noted DC power supply. Preferably, high frequency filters 126 are radially disposed around each aperture 104A, 104B, and are preferably well distributed and, more preferably, evenly spaced, to insure the noise travels through one or more of the plurality of high frequency filters 126 connected to each conductive land 124A, 124B rather than through transmission line pins 204A, 204B. In the embodiment illustrated in FIGS. 1B, 3A and 3B, 12 capacitors 126 are radially spaced around each aperture 104A, 104B. It should be appreciated, however, that any number of filters 126 can be used, depending on the desired capacitance and other factors. In the illustrated embodiment, conductive lands 124 have a rectangular shape. It should be understood, however, that the shape and size of each conductive land 124 can be selected to accommodate a desired quantity of high-frequency filters 126.

As one of ordinary skill in the art will find apparent, capacitors 126 are selected based on any combination of one or more criteria. For example, in the exemplary application it is preferred to create a low-impedance pathway for a range of frequencies in the range of between 100 MHz and 1 GHz, and more preferably between 30 Mhz and 2 GHz. It will be appreciated that because capacitors 126 are electrically parallel with each other, a selection of 12 capacitors 126 each having a capacitance of approximately 0.1 microfarads yields a low-impedance pathway for frequencies in the range of between approximately 30 MHz and 2 GHz. Filters of other capacitance can be selected based on a preferred range of frequencies to be filtered, the number of filters surrounding an aperture 104 and other considerations. A preferred range of impedances for the conductive path to chassis ground is less than 30 ohms, more preferably less than 10 ohms, and even more preferably between approximately 1 and 5 ohms. Further, capacitors 126 are preferably selected to safely accommodate a voltage potential expected between pins 204A, 204B and the chassis ground. For example, in this exemplary application providing power to telecom devices, capacitors 126 should accommodate a voltage potential of approximately 100VDC.

Details of the low impedance conductive path provided by filtering entry connector 100 will now be described. Referring to FIG. 1A, mating side 106 of base plate 102 has a conductive surface 132 adapted to electrically couple to back panel 252 to which base plate 102 is mounted. In the illustrative embodiment, this electrical coupling is facilitated by an electrical gasket 112, as described above. As best shown in FIG. 1A, conductive gasket 112 is a contiguous gasket that extends around the perimeter of base plate 102. Conductive gasket 112 can be manufactured of commonly available conductive foam or other materials now or later developed. For example, in alternative embodiments, gaskets comprising metallized material, conductive springs and the like are implemented. It should be appreciated that, although preferred, conductive gasket 112 need not be contiguous. In alternative embodiments, for example, gasket segments can be used.

Conductive surface 132 on mating side 106 facilitates the electrical connection between vias 122 and conductive gasket 112. As best shown in FIGS. 3A and 3B, conductive surface 132 is integral with conductive vias 122. In the embodiment shown in FIG. 1B, conductive surface 132 covers a substantial portion of mating side 106 of base plate 102. However, in one alternative embodiment, conductive surface 132 coats only that portion of mating side 106 which is in physical contact with conductive gasket 112. For example, conductive vias 122 can be integral with a conductive land extending along the perimeter of base plate 102. Such a conductive land may be sufficient to efficiently couple the conductive path of connector 100 with the conductive enclosure wall 252. Alternatively, such a conductive land can be used in conjunction with gasket 112 in which case the conductive land preferably has a width the same or larger that of conductive gasket 112.

As noted, in one embodiment, apertures 104 are formed as conductive through holes 302 to facilitate signal coupling. In such an embodiment, a conductive land 114A, 114B surrounds apertures 104A, 104B, respectively, on mating side 106. Conductive lands 114 are integral with the conductive through holes forming apertures 104. In the illustrated embodiment, conductive lands 114 are of an annular shape and surround each aperture 104, however in other embodiments the size and shape can vary and need not be annular. Conductive lands 114 are electrically isolated from conductive surface 132 by insulating regions 116 surrounding each conductive land 114. In the noted embodiment in which base plate 102 is a coated printed circuit board, such insulating regions 116 are formed by etching the conductive coating 132 to form a conductive void. As one of ordinary skill in the art should find apparent, other isolation means can be employed. It should also be appreciated that in alternative embodiments there are no conductive lands surrounding apertures 114 on mating side 106. In such an embodiment, there is no requirement for providing insulating regions 116.

As noted, a plurality of conductive vias 122 are disposed around the perimeter of base plate 102 to provide electrical coupling between the conductive surfaces 130, 132 of opposing sides 108, 106, respectively. Generally, conductive vias 122 have a conductive internal surface or surfaces, although other means such as conductive solid core pegs are envisioned. As one of ordinary skill in the art would find apparent, the size and spacing of conductive vias 122 are selected based on the range of frequencies to be coupled to the low potential sink. In one particular embodiment, conductive vias 122 are evenly spaced with center spacing not exceeding approximately 0.1 inches to provide low-impedance pathway for a range of frequencies in the range of between 100 MHz and 1 GHz, and more preferably between 30 Mhz and 2 GHz. In one alternative embodiment the edges of base plate 102 are plated. Such an edge plating would have dimensions sufficient to enable it to be conductively coupled to conductive coatings 130 and 132. Other implementations are considered to be within the scope of the present invention.

While various embodiments of the present invention have been described above, it should be understood that they have been presented by way of example only, and not limitation. For example, although the present invention has been described in connection with a telecommunications device, the present invention can be implemented in any device in which the emission of EMI over low frequency transmission lines is of concern. In addition, the present invention can be implemented to filter noise carried on a transmission line to prevent such noise from entering rather than exiting a device enclosure. As another example, the above embodiment depicted two transmission lines 202 traversing back panel 252 via a dedicated opening 256. However, it should be appreciated that any number of transmission lines can traverse the enclosure wall separately or collectively though one ore more openings. Further, the present invention can be implemented with any number of transmission lines; it need not be restricted to operating with the number and arrangement of transmission lines illustrated in above exemplary application. Also, high frequency filters 126 can be located on mating side 106 rather than the opposing filter side 108. As another example, filtering entry connector 100 includes a base plate 102 with opposing sides 106, 108 having substantially planar surfaces. It should be appreciated, however, that the portion of filtering connector 100 which is to abut external connector 200 should have a shape and contour suitable for facilitating the physical and electrical mating of entry connector 100 and connector 200. In the disclosed example, this is planar. However, in other embodiments, other shapes are contours can be implemented. As one of ordinary skill in the art should find apparent, in alternative embodiments, filtering connector 100 can include additional features which insure a complete and secure connection between connectors 100 and 200. Thus, the breadth and scope of the present invention should not be limited by any of the above-described exemplary embodiments, but should be defined only in accordance with the following claims and their equivalents.

What is claimed is:

1. An electromagnetic interference (EMI) filter for filtering noise from a Direct Current (DC) power signal transmission line at a location at which the transmission line traverses an enclosure wall of a device comprising a DC power source, the EMI filter comprising:
    a support structure configured to connect to a power connector of a DC power transmission line, wherein the support structure comprises a first receptacle configured to mate with a ground pin of the power connector and a second receptacle configured to mate with a DC power signal pin of the power connector; and
    a plurality of high frequency filters wherein when the EMI filter is mounted to the device enclosure wall (252) the plurality of filters are disposed circumferentially around the second receptacle of the support structure, and wherein the filters electrically couple the DC power signal pin to a low potential sink such that noise within a particular frequency range appearing on the transmission line is carried to the low potential sink through the high frequency filters.

2. The filter of claim 1, wherein the plurality of high frequency filters circumferentially disposed around the second receptacle are approximately evenly spaced.

3. The filter of claim 1, wherein the low potential sink comprises at least one of the group consisting of:
    a source of signals carried on the transmission line; and
    a ground potential.

4. The filter of claim 1, wherein each of the plurality of high frequency filters comprises:
    a capacitor.

5. The filter of claim 4, wherein each of the plurality of capacitors is a surface-mount capacitor.

6. The filter of claim 5, wherein each capacitor has a capacitance of between 0.001 and 0.05 microfarads.

7. The filter of claim 6, wherein each capacitor has a capacitance of approximately 0.01 microfarads.

8. The filter of claim 5, wherein the capacitors filter noise within a range of frequencies of approximately 30MHz to 2GHz.

9. The filter of claim 8, wherein the capacitors filter noise within a range of frequencies of approximately 100MHz to 1GHz.

10. The filter of claim 1,
    wherein the filter is implemented as an entry connector configured to physically and electrically mate with the power connector at the enclosure wall.

11. The filter of claim 10, wherein the support structure is mounted to the enclosure wall, the filter further comprising:
    an internal connector connected to the DC power source; and
    wherein a first conductive path couples the DC power signal pin and the internal connector when the power connector is mated with the support structure; and
    wherein a second conductive path couples the high frequency filters to the low potential sink.

12. The filter of claim 11, wherein the support structure is configured to be mounted to the enclosure wall to substantially cover an enclosure wall opening while providing access to the second receptacle through the enclosure opening.

13. The filter of claim 11, wherein the enclosure provides a conductive path to the low potential sink, and wherein the filtering entry connector further comprises:
    a conductive gasket configured to be interposed between the support structure and the enclosure wall to facilitate electrical coupling between the second conductive path to the conductive path to the low potential sink provided by the enclosure.

14. The filter of claim 11, wherein the support structure comprises a printed circuit board.

15. The filter of claim 14,
    wherein the first conductive path coupling the DC power signal pin and the internal connector is a conductive land disposed on the filtering side of the printed circuit board; and wherein the high frequency filters are capacitors having one lead connected to the conductive land and another lead connected to the second conductive path.

16. The filter of claim 11,
wherein the support structure is a printed circuit board having a mating side for receiving the DC power signal pin and an opposing filtering side on which the high frequency filters are mounted;
wherein the second receptacle comprises an aperture extending through the printed circuit board from the mating side to the filtering side and configured to enable the DC power signal pin to matingly extend therethrough.

17. The filter of claim 16, wherein the low impedance conductive path comprises:
a conductive surface disposed on the filtering side of the printed circuit board;
a conductive surface disposed on the mating side of the printed circuit board; and
means for conductively coupling the conductive pathways.

18. The filter of claim 17, wherein the conductive coupling means comprises:
a plurality of conductive vias disposed around the perimeter of the printed circuit board,
wherein said conductive vias are electrically integral with each of the conductive surfaces.

19. An entry connector for use in an electrical device comprising an enclosure comprising a Direct Current (DC) power source and a wire connected to the DC power source and in which noise is parasitically induced in the wire, the entry connector configured to mate the wire with a power connector at which a DC power signal transmission line terminates, and for preventing the induced noise from being emitted from the device enclosure via the DC power signal transmission line, the entry connector comprising:
a printed circuit board (PCB) configured to be mounted adjacent to an opening in a wall of the enclosure, the PCB comprising:
a first receptacle configured to be mated with a ground pin of the power connector; and
a second receptacle configured to be mated with a DC power signal pin of the power connector;
a first conductive path coupling the DC power signal pin with the wire when mated;
a plurality of capacitors mounted on the printed circuit board disposed circumferentially around the second receptacle and configured to be electrically coupled to the DC power signal pin when mated; and
a second conductive path coupling the capacitors to a low potential sink.

20. The entry connector of claim 19, wherein the capacitors are well distributed around the receptacle.

21. The entry connector of claim 19, wherein the low potential sink comprises at least one of the group consisting of:
a source of signals carried on the transmission line; and
a ground potential.

22. The entry connector of claim 19, wherein the PCB is configured to be mounted to the enclosure wall to substantially cover the enclosure wall opening while providing access to the first and second receptacles through the enclosure opening.

23. The entry connector of claim 19, wherein the enclosure provides a conductive path to the low potential sink, and wherein the power connector further comprises:
a conductive gasket configured to be interposed between the conductive pathway on the second side of the printed circuit board and the enclosure wall.

24. The entry connector of claim 19,
wherein the first conductive path is a conductive land disposed on the a first side of the printed circuit board; and
wherein the capacitors have one lead connected to the conductive land and another lead connected to the second conductive path,
wherein the first receptacle is an aperture extending through the printed circuit board from a second side to the first side of the printed circuit board, the aperture configured to matingly receive the DC power signal pin.

25. The entry connector of claim 24, wherein the second conductive path comprises:
conductive pathways disposed on the first and second sides of the printed circuit board; and
a plurality of conductive vias disposed around the perimeter of the printed circuit board electrically coupled to each of the conductive pathways.

26. A device comprising:
a Direct Current (DC) power source;
at least one electrical component that can emit electromagnetic interference (EMI);
an enclosure defining an interior of the device in which the at least one component is located;
at least one wire coupled to the DC power source and disposed within the enclosure susceptible to having noise induced thereon from the emitted EMI; and
an entry connector configured to mate to a power connector terminating a DC power signal transmission line, comprising:
a printed circuit board (PCB) configured to be mounted on an interior surface of a wall of the enclosure covering at least in part a portion of an opening in the wall;
means, disposed on the PCB, for electrically coupling a DC power signal pin of the power connector with the internal wire;
means, disposed on the PCB, for coupling a ground pin of the power connector with a low potential sink; and
a plurality of means, each disposed on the PCB circumferentially around the wire, for filtering to the low potential sink the noise indicted on the wire at the means for electrically coupling the DC power signal pin immediately adjacent to the enclosure wall.

* * * * *

UNITED STATES PATENT AND TRADEMARK OFFICE
CERTIFICATE OF CORRECTION

PATENT NO. : 7,182,644 B2 Page 1 of 1
APPLICATION NO. : 10/426229
DATED : February 27, 2007
INVENTOR(S) : Andrew Michael Cherniski et al.

It is certified that error appears in the above-identified patent and that said Letters Patent is hereby corrected as shown below:

In column 3, line 29, after "negative" delete "484" and insert -- 48 --, therefor.

In column 7, line 29, after "50A" delete "an" and insert -- and --, therefor.

Signed and Sealed this

Fifth Day of January, 2010

David J. Kappos
*Director of the United States Patent and Trademark Office*